(12) United States Patent
Seo et al.

(10) Patent No.: US 12,620,359 B2
(45) Date of Patent: May 5, 2026

(54) DISPLAY DEVICE INCLUDING ONE OR MORE BLOCKS IN NON-DISPLAY AREA

(71) Applicant: LG Display Co., Ltd., Seoul (KR)

(72) Inventors: Jeong-Rim Seo, Paju-si (KR);
Soo-Hong Choi, Paju-si (KR);
Hong-Jae Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/589,186

(22) Filed: Feb. 27, 2024

(65) Prior Publication Data

US 2024/0290283 A1     Aug. 29, 2024

(30) Foreign Application Priority Data

Feb. 28, 2023     (KR) ......................... 10-2023-0026633

(51) Int. Cl.
| | |
|---|---|
| *G09G 3/3266* | (2016.01) |
| *H10K 59/121* | (2023.01) |
| *H10K 59/122* | (2023.01) |
| *H10K 59/126* | (2023.01) |
| *H10K 59/131* | (2023.01) |

(52) U.S. Cl.
CPC ....... *G09G 3/3266* (2013.01); *H10K 59/1213* (2023.02); *H10K 59/122* (2023.02); *H10K 59/126* (2023.02); *H10K 59/1315* (2023.02); *G09G 2310/0291* (2013.01)

(58) Field of Classification Search
CPC .. G09G 3/3266; G09G 3/3208; G09G 3/3225; G09G 2310/0291; G09G 2310/0202; H10K 59/1213; H10K 59/122; H10K 59/126; H10K 59/1315; H10K 59/131; H10K 59/88; H10K 59/10; H10K 59/8052; H10K 59/873; G09F 9/335
See application file for complete search history.

(56) References Cited

U.S. PATENT DOCUMENTS

| | | | |
|---|---|---|---|
| 2012/0235983 A1* | 9/2012 | Sakamoto | G09G 3/3677 345/212 |
| 2015/0269897 A1* | 9/2015 | Kitsomboonloha | G06F 3/04166 345/87 |
| 2019/0115403 A1* | 4/2019 | Kang | H10D 86/441 |
| 2021/0296367 A1* | 9/2021 | Seo | H10K 59/1315 |
| 2022/0255038 A1* | 8/2022 | Wang | H10K 59/80522 |
| 2023/0126436 A1* | 4/2023 | Bai | G11C 19/28 345/204 |

(Continued)

FOREIGN PATENT DOCUMENTS

| | | | | |
|---|---|---|---|---|
| KR | 20130037944 A | * | 4/2013 | ......... G02F 1/13458 |
| KR | 20210084867 A | * | 7/2021 | ........... G09G 3/3208 |

*Primary Examiner* — Stephen G Sherman
(74) *Attorney, Agent, or Firm* — Birch, Stewart, Kolasch & Birch, LLP

(57) ABSTRACT

A display device in one example includes a substrate including a display area and a non-display area disposed at at least one side of the display area, a clock signal line disposed in the non-display area, a spare area disposed between the clock signal line and the display area, and a block disposed in the spare area. The display area includes a plurality of pixels, and each of the plurality of pixels includes at least one switching transistor and at least one driving transistor. The block can include an opaque metal layer and an area corresponding to the spare area, which is disposed in the spare area.

20 Claims, 7 Drawing Sheets

(56)                     References Cited

U.S. PATENT DOCUMENTS

2023/0320176 A1 * 10/2023 Heo ..................... H10K 59/122
                                                                257/40

* cited by examiner

Gate Circuit

DISPLAY DEVICE INCLUDING ONE OR MORE BLOCKS IN NON-DISPLAY AREA

CROSS-REFERENCE TO RELATED APPLICATIONS

The present application claims priority to Korean Patent Application No. 10-2023-0026633, filed in Republic of Korea on Feb. 28, 2023, the entire contents of which are hereby expressly incorporated by reference into the present application.

BACKGROUND

Technical Field

The present disclosure relates to a display device, and more particularly, for example, without limitation, to an arrangement of a gate driving panel circuit, peripheral wirings and a spare region.

Discussion of the Related Art

An organic light emitting display device is an emissive type device that does not include a backlight unit used in a non-emissive type device such as a liquid crystal display (LCD) device. In addition, the organic light emitting display device has advantages in low power consumption, color-productivity, a response time, a viewing angle, a contrast ratio so that it is developed as a next-generation display.

A display device can include a display panel, where a plurality of date lines and a plurality of gate lines are disposed, a data driving circuit outputting a data signal to the plurality of data lines and a gate driving panel circuit outputting a gate signal to the plurality of gate lines.

The description provided in the description of the related art section should not be assumed to be prior art merely because it is mentioned in or associated with the description of the related art section. The description of the related art section can include information that describes one or more aspects of the subject technology, and the description in this section does not limit the invention.

SUMMARY OF THE DISCLOSURE

The inventors have recognized the limitations of display device in aspects of size and performance. Accordingly, the present disclosure is directed to a display device that substantially obviates one or more of the problems due to limitations and disadvantages of the related art.

An object of the present disclosure is to provide a display device being capable of preventing a light leakage from a spare region in a non-display area.

An object of the present disclosure is to provide a display device having a narrow bezel area.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes a substrate including a display area and a non-display area disposed at at least one side of the display area; a clock signal line disposed in the non-display area; a spare area disposed between the clock signal line and the display area; and a block disposed in the spare area.

Other detailed matters of the example embodiments are included in the detailed description and the drawings.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

Figure 1:
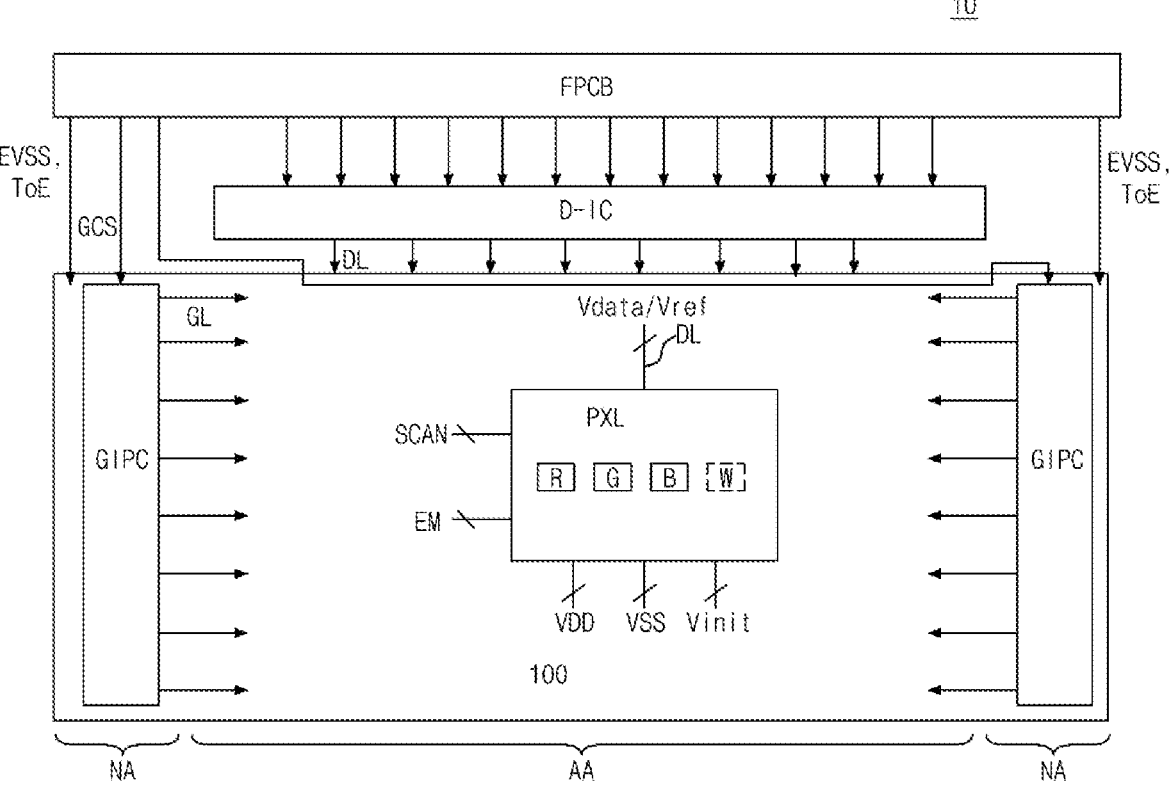
FIG. 1 is a block diagram showing a display device according to an example embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

The shapes, sizes, areas, ratios, angles, numbers, and the like, which are illustrated in the drawings to describe various example embodiments of the present disclosure, are merely given by way of example. Therefore, the present disclosure is not limited to the illustrations in the drawings. Like reference numerals refer to like elements throughout the specification, unless otherwise specified. Where the terms such as "include," "have," "comprise," "contain," "constitute," "make up of," "formed of," and "consist of" and the like are used, one or more other elements can be added unless the term, such as "only," is used. An element described in the singular form is intended to include a plurality of elements, and vice versa, unless the context clearly indicates otherwise.

In construing an element, the element is to be construed as including an error or a tolerance range even where no explicit description of such an error or tolerance range is provided.

Where positional relationships are described, for example, where the positional relationship between two parts is described using "on", "above", "over", "below", "under", "beside", "beneath", "near", "close to," "adjacent to", "on a side of", "next" or the like, one or more other parts can be located between the two parts unless a more limiting term, such as "immediate(ly)," "direct(ly)," or "close(ly)" is used. For example, where an element or layer is disposed "on" another element or layer, a third layer or element can be interposed therebetween.

Spatially relative terms, such as "under," "below," "beneath," "lower," "over," "upper" and the like, can be used herein for ease of description to describe one element or feature's relationship to another element(s) or feature(s) as illustrated in the figures. It will be understood that the spatially relative terms can encompass different orientations of an element in use or operation in addition to the orientation depicted in the figures. For example, if an element in the figures is inverted, elements described as "below" or "beneath" other elements or features would then be oriented "over" the other elements or features. Thus, the exemplary term "below" can encompass both an orientation of below and above. Similarly, the exemplary term "above" or "over" can encompass both an orientation of "above" and "below".

Although the terms "first," "second," A, B, (a), (b), and the like can be used herein to refer to various elements, these elements should not be interpreted to be limited by these terms as they are not used to define a particular order, sequence or precedence. These terms are only used to distinguish one element from another. For example, a first element could be termed a second element, and, similarly, a second element could be termed a first element, without departing from the scope of the present disclosure.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

A term "device" (or apparatus) used herein can refer to a display device including a display panel and a driver for driving the display panel. Examples of the display device can include an organic light emitting diode (OLED), and the like. In addition, examples of the device can include a notebook computer, a television, a computer monitor, an automotive device, a wearable device, and an automotive equipment device, and a set electronic device (or apparatus) or a set device (or apparatus), for example, a mobile electronic device such as a smartphone or an electronic pad, which are complete products or final products respectively including OLED and the like, but embodiments of the present disclosure are not limited thereto.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

A size and a thickness of each component illustrated in the drawing are illustrated for convenience of description, and the present disclosure is not limited to the size and the thickness of the component illustrated.

Features of various embodiments of the present disclosure can be partially or entirely coupled to or combined with each other. They can be linked and operated technically in various ways as those skilled in the art can sufficiently understand. The embodiments can be carried out independently of or in association with each other in various combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

In the aspects of the present disclosure, a source electrode and a drain electrode are distinguished from each other, for convenience of description. However, the source electrode and the drain electrode are used interchangeably. The source electrode can be the drain electrode, and the drain electrode can be the source electrode. Further, the source electrode in any one aspect of the present disclosure can be the drain electrode in another aspect of the present disclosure, and the drain electrode in any one aspect of the present disclosure can be the source electrode in another aspect of the present disclosure.

Reference will now be made in detail to some of the examples and example embodiments, which are illustrated in the accompanying drawings. All the components of each display device or apparatus according to all embodiments and examples of the present disclosure are operatively coupled and configured.

FIG. 1 is a block diagram showing a display device according to an example embodiment of the present disclosure.

Referring to FIG. 1, a display device 10 can include a plurality of areas. For example, the display device 10 can include at least one display area (active area) AA, which is an area displaying an image, in a display panel, and a pixel array PXL is formed in the display area AA.

The display device 10 can include a non-display area (non-active area) NA disposed at at least one side of the display area AA. For example, the non-display area NA can be adjacent to or surrounding the display area AA. The non-display area NA can be disposed only at certain side(s) of the display area AA, or can surround the entire display area AA.

At least one non-display area NA, where an image is not displayed, can include a driving circuit part. The non-display area NA can be disposed at one side of the display area AA. The non-display area NA can be disposed at adjacent sides of the display area AA.

Referring to FIG. 1, the non-display area NA can be disposed to surround the rectangular display area AA. However, the size, shape and configuration of the display area AA as well as those of the non-display area NA can vary.

The non-display area (NA) can surround the rectangular display area (AA) and be located outside. However, it should be understood that the shapes of the display area AA and the arrangement of the non-display area NA adjacent to the display area AA are not specifically limited to the example display device 10 shown in FIG. 1. The display area AA and the non-display area NA can have any shape of the display device 10. Non-limiting examples of such shapes can include a pentagon shape, a hexagon shape, a circular shape, an oval shape, and the like, and the embodiments of the present disclosure are not limited thereto.

Each pixel PXL in the display area AA includes subpixels, and the subpixels can include a red subpixel, a green subpixel and a blue subpixel, but other colors or color combinations are possible. The plurality of subpixels can include first, second, third and fourth subpixels SP1, SP2, SP3 and SP4. Each of the first, second, third and fourth subpixels SP1, SP2, SP3 and SP4 is connected to the gate line GL and the data line DL. For example, the first, second, third and fourth subpixels SP1, SP2, SP3 and SP4 can correspond to red, green, blue and white, respectively. Alternatively, the plurality of subpixels can include first, second, and third subpixels SP1, SP2, and SP3.

Each of the first, second, and third subpixels SP1, SP2, and SP3 is connected to the gate line GL and the data line DL. For example, the first, second, and third subpixels SP1, SP2, and SP3 can correspond to red, green, and blue, respectively. For example, the red, green, blue, and white sub-pixels or the red, green, and blue sub-pixels can be disposed in a repeated manner, or the red, green, blue, and white sub-pixels can be disposed in a quad type. For example, the red sub pixel, the blue sub pixel, the green sub pixel and the white sub pixel can be sequentially disposed along the row direction, or the red sub pixel, the blue sub pixel, and the green sub pixel can be sequentially disposed along a row direction.

However, in the example embodiment of the present disclosure, the color type, disposition type, and disposition order of the sub-pixels are not limiting, and can be configured in various forms according to light-emitting character-istics, device lifespans, and device specifications.

Meanwhile, the sub-pixels can have different light-emit-ting areas according to light-emitting characteristics. For example, a sub-pixel that emits light of a color different from that of a blue sub-pixel can have a different light-emitting area from that of the blue sub-pixel. For example, the red sub-pixel, the blue sub-pixel, and the green sub-pixel, or the red sub-pixel, the blue sub-pixel, the white sub-pixel, and the green sub-pixel can each has a different light-emitting area.

In addition, the pixel and the subpixel can be related to a pixel circuit including at least one thin film transistor (TFT) manufactured on a substrate of the display device 10. Each pixel circuit can be connected to a gate line GL and a data line DL to communicate with at least one driving circuit, e.g., a gate driving panel circuit (GIPC) and a data driver D-IC in the non-display area NA. The gate driving panel circuit GIPC can be a gate-in-panel (GIP) type.

As shown in FIG. 1, at least one driving circuit can be realized by at least one TFTs disposed in the non-display area NA. The driving circuit can include a clock signal line, a gate driving panel circuit and a gate power voltage line in the non-display area NA.

The gate power voltage line can include a gate high potential power voltage line and a gate low potential power voltage line.

The gate driving panel circuit (GIPC) can be realized by using a plurality of TFTs on the substate of the display device 10. Non-limiting examples of the circuit realized by the TFTs on the substrate can include an inverter circuit, a multiplexer, and an electro static discharge or electrostatic discharge (ESD) circuit, and the embodiments of the present disclosure are not limited thereto.

Some driving circuits can be provided as integrated circuit (IC) chips and can be mounted within the non-display area NA of the display panel using chip-on-glass (COG) or other similar methods. Additionally, some driving circuits can be mounted on another substrate or can be coupled to a con-nection interface (pads/bumps, pins) placed in the non-display area NA using a printed circuit such as a flexible printed circuit board (PCB), chip-on-film (COF), tape-car-rier-package (TCP), or other suitable technologies.

The driving circuits, e.g., GIP, have gate drive ICs (inte-grated circuits) built into the display panel. The number of drive ICs can be decreased so that the production cost can be reduced. In addition, high-speed scan signals can be pro-vided to the display area of the display panel.

Referring to FIG. 1, a low potential voltage (EVSS), a touch signal (ToE), and a gate control signal (GCS), which are output from a flexible printed circuit board (FPCB), are applied to the display panel, and the high potential voltage is applied to the display panel through the data driver D-IC.

Figure 2:
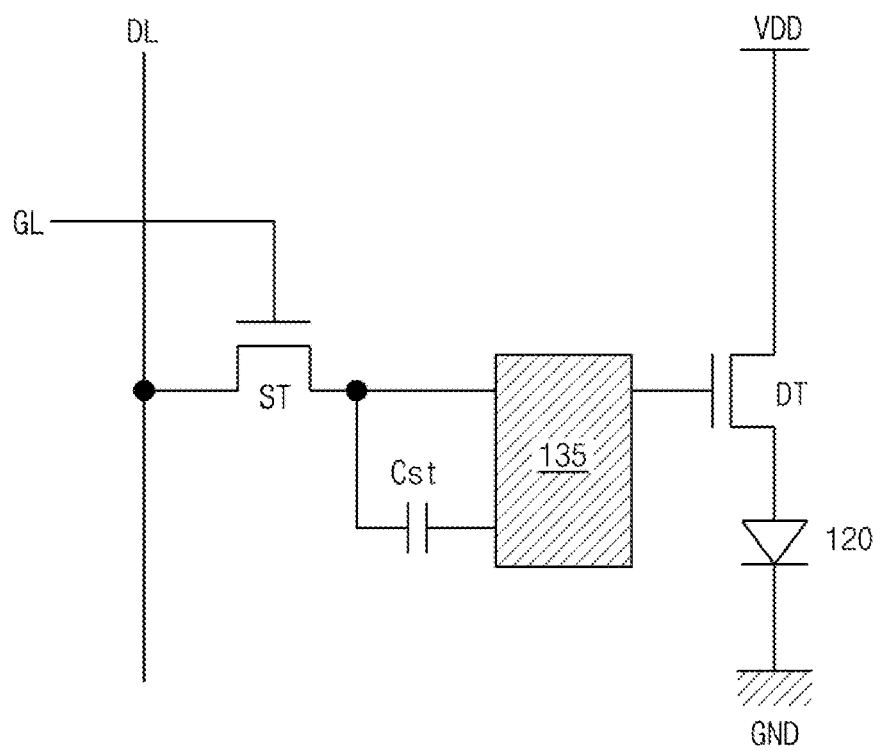
FIG. 2 is a circuit diagram showing a subpixel of a display device according to an example embodiment of the present disclosure.

FIG. 2 is a circuit diagram showing a subpixel of a display device according to an example embodiment of the present disclosure. The subpixel of FIG. 1 can have the subpixel configuration of FIG. 2, but is not limited thereto.

Referring to FIG. 2, a subpixel of the display device 10 according to an example embodiment of the present disclo-sure can include a switching TFT ST, a driving TFT DT, a compensation circuit 135 and a light emitting element 120.

The light emitting element 120 can be operated to emit light depending on a driving current by the driving TFT DT.

The switching TFT ST can be switched to store a date signal, which is supplied through the data line DL when the switching TFT ST is turned on by a gate signal through the gate line GL, in a capacitor Cst as a data voltage.

The driving TFT DT can be operated to flow a constant driving current between a high potential voltage line VDD and a low potential voltage line GND in correspondence to the data voltage in the capacitor Cst.

The subpixel in FIG. 2 has a 2T1C structure including the switching TFT ST, the driving TFT DT, the capacitor Cst and the light emitting element. Alternatively, when the compen-sation circuit 135 is included, the subpixel can have a structure of 3T1C, 4T2C, 5T2C, 6T1C, 6T2C, 7T1C, 7T2C, or the like.

Active layers of the switching TFT ST, the driving TFT DT can be formed of a semiconductor material, such as an oxide semiconductor material, amorphous semiconductor material, polycrystalline semiconductor material, or organic semiconductor material, but are not limited thereto.

The oxide semiconductor material can have an excellent effect of preventing a leakage current and relatively inex-pensive manufacturing cost. The oxide semiconductor can be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor can include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor can be made of polycrystalline silicon (poly-Si), but is not limited thereto.

The amorphous semiconductor material can be made of amorphous silicon (a-Si), but is not limited thereto.

Figure 3:
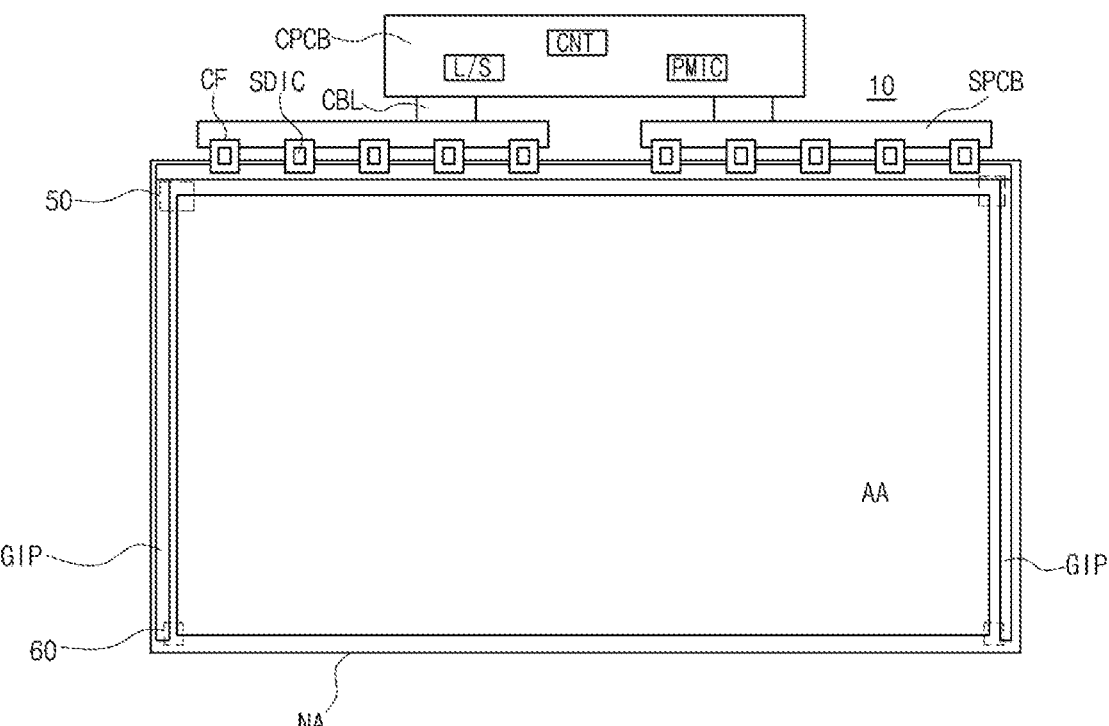
FIG. 3 is a schematic view illustrating a display device according to an example embodiment of the present disclosure.

FIG. 3 is a schematic view illustrating a display device according to an example embodiment of the present disclosure.

Referring to FIG. 3, the gate driving circuit area GIP is disposed at both sides of the display area AA, and one side of the display area AA can be connected to a flexible printed circuit board (FPCB).

The data driving circuit can include a plurality of source driver integrated circuits SDIC and can be provided as a chip-on-film (COF) type. Each of the plurality of source driver integrated circuits SDIC can be mounted (or installed) on a circuit film CF, which is connected to the non-display area NA of the display panel. The circuit film CF can be referred to as a flexible printed circuit.

According to an example embodiment of the present disclosure, the gate driving circuit area GIP can be provided by a gate-in-panel (GIP) type.

The display device 10 can include at least one source printed circuit board SPCB for the circuit connection between the plurality of source driver integrated circuits SDIC and other elements, e.g., a controller CNT, a level shifter L/S, a power management integrated circuit PMIC, or the like, and a control printed circuit board CPCB for mounting control components and various electrical devices.

The circuit film CF, on which the source driver integrated circuit SDIC is mounted, can be connected to at least one source printed circuit board SPCB.

Namely, one side of the circuit film CF, on which the source driver integrated circuit SDIC is mounted, can be electrically connected to the display panel 110, and the other side of the circuit film CF can be electrically connected to the source printed circuit board SPCB.

The controller CNT can perform overall control functions related to driving the display panel 110 and can control the operations of the plurality of source driver integrated circuits SDIC and the gate driving panel circuits GIPC.

To control the plurality of source driver integrated circuits SDIC and the gate driving panel circuits GIPC, the controller CNT receives timing signals, such as the vertical synchronization signal, horizontal synchronization signal, input data enable signal, and clock signal, generates various control signals DCS and GCS, and outputs the control signals to the plurality of source driver integrated circuits SDIC and the gate driving panel circuits GIPC. Here, the horizontal synchronization signal is a signal representing a time taken to display one horizontal line of a screen and the vertical synchronization signal is a signal representing a time taken to display a screen of one frame. The input data enable signal can correspond to a signal indicating a period for which a data voltage is supplied to the pixel.

A power management integrated circuit PMIC can supply various voltages or currents or control various voltages or currents to be supplied to the plurality of source driver integrated circuits SDIC and the gate driving panel circuits GIPC.

At least one source printed circuit board SPCB and the control printed circuit board CPCB can be connected through at least one connection cable CBL. For example, the connection cable CBL can be one of a flexible printed circuit (FPC) and a flexible flat cable (FFC).

At least one source printed circuit board SPCB and the control printed circuit board CPCB can be provided as one printed circuit board.

The display device 10 according to an example embodiment of the present disclosure can further include the level shifter L/S for adjusting the voltage level of the signal. For example, the level shifter L/S can be disposed on the control printed circuit board CPCB or the source printed circuit board SPCB.

Figure 4:
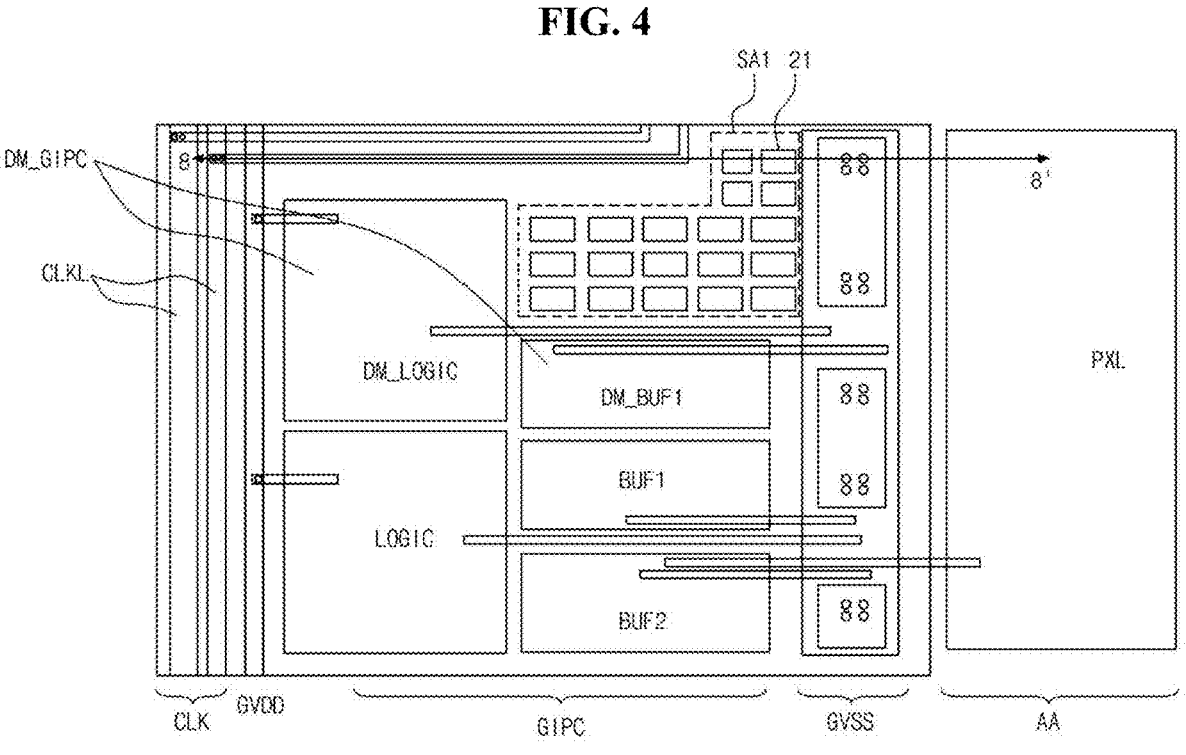
FIG. 4 is an enlarged plan view of a portion in FIG. 3.

FIG. 4 is an enlarged plan view of a portion in FIG. 3.

Referring to FIG. 4, the clock line unit CLK adjacent to the gate driving panel circuit GIPC can be positioned on one side of the gate driving panel circuit GIPC and can be a plurality of clock signal lines CLKL.

The plurality of clock signal lines CLKL can output a signal to the gate driving panel circuit GIPC. The gate driving panel circuit GIPC generates a plurality of gate signals (e.g., a scan signal (SC), a sensing signal (SE) or the like) based on a plurality of clock signals, which is input from the level shifter L/S, and outputs the gate signals to a plurality of lines (e.g., a scan signal line, a sensing signal line or the like).

The high potential power voltage of the gate high potential voltage line GVDD can be input to a logic unit of the gate driving panel circuit GIPC. The gate high potential voltage line GVDD can be a plurality of lines.

The gate driving panel circuit GIPC can include a logic unit LOGIC and a buffer unit for output.

The logic unit LOGIC can be a circuit that controls the operation of the buffer unit and realizing the operation of a shift register. The logic unit LOGIC can control the voltages of a Q node and a QB node to control the operation of the buffer unit.

The buffer unit can include a first buffer unit BUF1 for outputting a first scan signal and a second buffer unit BUF2 for outputting a second scan signal.

The first buffer unit BUF1 is disposed at a side of the second buffer unit BUF2, and a space is provided between the first and second buffer units BUF1 and BUF2. At least one line connecting the logic unit LOCIG, the gate low potential voltage line GVSS and the display area AA can be disposed in the space between the first and second buffer units BUF1 and BUF2.

Figure 5:
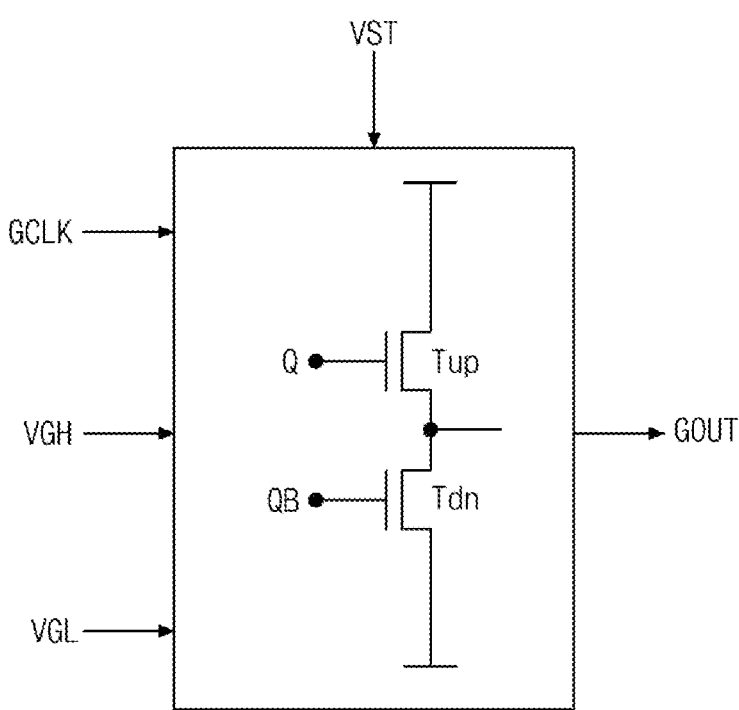
FIG. 5 is a schematic circuit diagram of a circuit included in a gate driving panel circuit (GIPC) in a display device according to an example embodiment of the present disclosure.

FIG. 5 is a schematic circuit diagram of a circuit included in a gate driving panel circuit (GIPC) in a display device according to an example embodiment of the present disclosure.

Referring to FIG. 5, the gate circuit can include a pull-up transistor Tup controlled by the Q node and a pull-down transistor Tdn controlled by the QB node. The pull-up transistor Tup can control the output of a turn-on level of the scan signal, and the pull-down transistor Tdn can control the output of a turn-off level of the scan signal.

The gate circuit can include a plurality of transistors and at least one capacitor for controlling the voltage level of the Q node and the voltage level of the QB node.

The gate circuit can receive various signals and voltages and output the scan signals according to the driving of the pull-up transistor Tup by the Q node and the driving of the pull-down transistor Tdn by the QB node.

For example, the gate circuit can receive a gate start signal VST and at least one gate clock signal GCLK for controlling driving timing. The gate start signal VST can be a carry signal output from another gate circuit.

The gate circuit can receive one or more driving voltages, and can receive a first gate driving voltage VGH from the gate high potential voltage line GVDD and a second gate driving voltage VGL from the gate low potential voltage line GVSS. For example, the first gate driving voltage VGH can be a high potential driving voltage, and the second gate driving voltage VGL can be a low potential driving voltage.

The gate circuit controls the Q node and QB node by various input signals and voltages and can output the gate signal at a set timing.

The circuit elements, which control the Q node and QB node, in the gate circuit can be configured in various ways, but are not limited thereto.

A part 50 (of FIG. 3) is a starting portion of the gate driving panel circuit GIPC, and a dummy gate driving panel circuit DM_GIPC is disposed at the top.

The dummy gate driving panel circuit DM_GIPC can have the same line structure and transistors as the other gate driving panel circuit GIPC for mask manufacturing and process convenience.

Referring to FIG. 4, the dummy gate driving panel circuit DM_GIPC can include a dummy logic unit DM_LOGIC and a first dummy buffer unit DM_BUF1. The dummy logic unit DM_LOGIC can be configured and operated in the same form as the other logic unit LOGIC. In this case, the output terminal of the first dummy buffer unit DM_BUF1 may not be connected to the display area.

Unlike the first and second buffer units BUF1 and BUF2, the first dummy buffer unit DM_BUF1, which is not connected to the display area AA, can omit a transistor, thereby reducing the area of the first dummy buffer unit DM_BUF1.

The first dummy buffer unit DM_BUF1, which is not used for screen output, can be configured as a feedback circuit, unlike the first and second buffer units BUF1 and BUF2.

The first dummy buffer unit DM_BUF1 as the feedback circuit is included in the gate driving panel circuit GIPC and provides a feedback voltage GVDD_FB to a gate high potential compensation circuit that senses and compensates for the deterioration of the gate driving panel circuit GIPC. The gate high potential compensation circuit can generate and supply a compensation voltage to the gate driving panel circuit GIPC.

Figure 6:
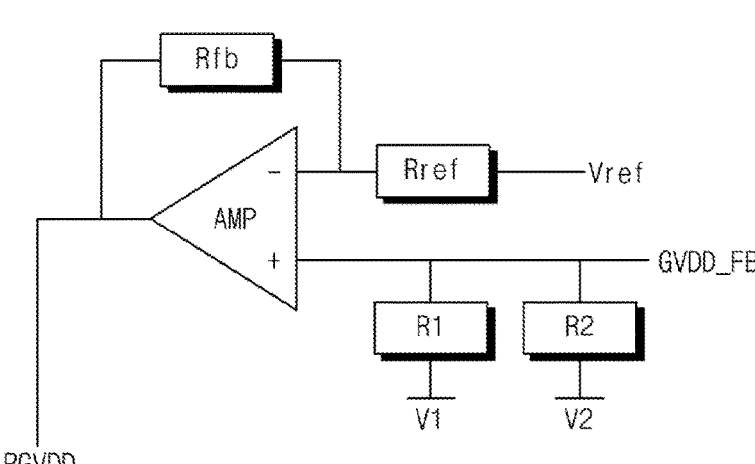
FIG. 6 is an exemplary circuit diagram of a gate high potential compensation circuit in a display device according to an example embodiment of the present disclosure.

FIG. 6 is an exemplary circuit diagram of a gate high level compensation circuit in a display device according to an example embodiment of the present disclosure.

Referring to FIG. 6, the gate high potential compensation voltage PGVDD generated in the gate high potential compensation circuit 20 can be connected to the gate high potential voltage line GVDD of the gate driving panel circuit GIPC.

When the gate high potential compensation voltage PGVDD is applied to the gate high potential voltage line GVDD, stress can be alleviated by lowering the gate-source voltage on the transistor for stabilization of the gate driving panel circuit GIPC.

Referring to FIG. 4, a size of the first dummy buffer unit DM_BUF1 is reduced so that there is a first spare area SA1 in the starting portion, where the dummy gate driving panel circuit DM_GIPC is disposed, of the gate driving panel circuit GIPC. Namely, a line (wire) and/or a transistor are not presented in the first spare area SA1 being empty.

The first spare area SA1 can be disposed between the clock line unit CLK and the display area AA.

The first spare area SA1 can be disposed at the top of the gate driving panel circuit GIPC in the display device 10. In other words, the first spare area SA1 can be disposed to be adjacent to a starting portion of the gate driving panel circuit GIPC.

When the gate driving panel circuit GIPC is located at both sides of the display area AA in the display device 10, the first spare area SA1 can be presented in a starting portion of the gate driving panel circuit GIPC at both sides of the display area AA.

The first spare area SA1, where lines and transistors are not formed, is empty, and insulating layers and a cathode electrode can be disposed in the first spare area SA1, for example only insulating layers and a cathode electrode can be disposed in the first spare area SA1. In this case, external light can pass through and the first spare area SA1 can be perceived by the user.

To prevent this problem, in the display device 10 of the present disclosure, a block 21 of an opaque metal layer is formed in the first spare area SA1.

The block 21 can be a single block having an area substantially corresponding to the first spare area SA or can include a plurality of blocks arranged in the first spare area SA1. In FIG. 4, each of the plurality of blocks 21 is shown to have a rectangle shape, but shape and size of each of the plurality of blocks 21 are not limited thereto, for example, each of the plurality of blocks 21 can have a polygon shape, a circular shape, an oval shape or the like, and a size of each of the plurality of blocks 21 can be the same or different.

Figure 7:
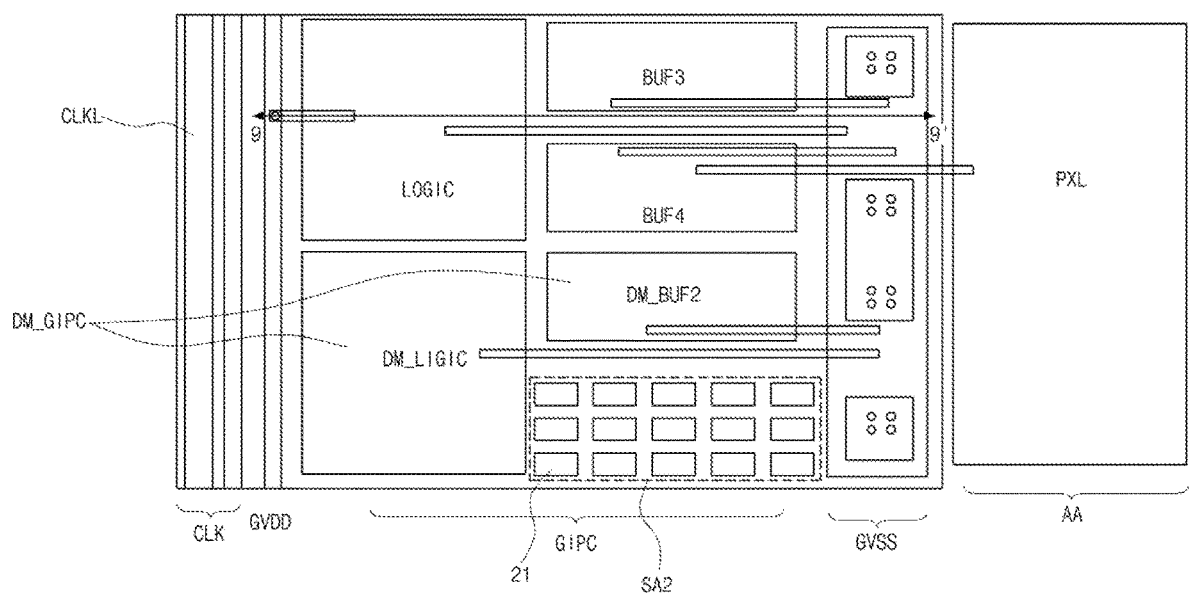
FIG. 7 is an enlarged plan view of another portion in FIG. 3.

FIG. 7 is an enlarged plan view of another portion in FIG. 3.

Referring to FIG. 7, when the gate driving panel circuit GIPC is located at both sides of the display area AA, the dummy logic unit DM_LOGIC and the second dummy buffer unit DM_BUF2, which are a dummy gate driving panel circuit DM_GIPC, are also disposed at an end of the gate driving panel circuit GIPC.

Like the first dummy buffer unit DM_BUF1, the second dummy buffer unit DM_BUF2 provides the feedback voltage GVDD_FB to the gate high potential compensation circuit 20, which senses and compensates for the deterioration of the gate driving panel circuit GIPC. In addition, the gate high potential compensation circuit 20 generates and outputs a compensation voltage to the gate driving panel circuit GIPC.

Since an area of the second dummy buffer unit DM_BUF2 is reduced, a second spare area SA2 being an empty is generated at the end, where the dummy gate driving panel circuit DM_GIPC is disposed, of the gate driving panel circuit GIPC.

The second spare area SA2 can be disposed at the bottom of the gate driving panel circuit GIPC in the display device 10. In other words, the first spare area SA1 can be disposed to be adjacent to an ending portion of the gate driving panel circuit GIPC.

When the gate driving panel circuit GIPC is located at both sides of the display area AA in the display device 10, the second spare area SA2 can be presented in a starting portion of the gate driving panel circuit GIPC at both sides of the display area AA.

The second spare area SA2, where lines and transistors are not formed, is empty, and insulating layers and a cathode electrode can be disposed in the second spare area SA2, for example, only insulating layers and a cathode electrode can be disposed in the second spare area SA2. In this case, external light can pass through and the second spare area SA2 can be perceived by the user.

To prevent this issue, in the display device 10 of the present disclosure, a block 21 of an opaque metal layer is formed in the second spare area SA2.

The block 21 can be a single block having an area substantially corresponding to the first spare area SA or can include a plurality of blocks arranged in the second spare area SA2. In FIG. 7, each of the plurality of blocks 21 is shown to have a rectangle shape, but shape and size of each of the plurality of blocks 21 are not limited thereto, for example, each of the plurality of blocks 21 can have a polygon shape, a circular shape, an oval shape or the like, and a size of each of the plurality of blocks 21 can be the same or different.

The first spare area SA1 and the second spare area SA2 are located at the starting portion and ending portion of the gate driving panel circuit GIPC at the upper and lower ends of both sides of the display area AA, for example, the first and second spare areas SA1 and SA2 can be arranged in at least four areas within the display device 10.

In the non-display area NA, the clock line unit CLK, the gate high potential voltage line GVDD, the gate driving panel circuit GIPC, and the gate low potential voltage line GVSS can be disposed. The block 21 can be positioned between the clock line unit CLK and the gate low potential voltage line GVSS. The block 21 can be arranged as one block with an area that can fill in each of the first and second spare areas SA1 and SA2, or a plurality of blocks 21 can be arranged within each of the first and second spare areas SA1 and SA2.

The lines and transistors in the non-display area NA and the display area AA can be formed and arranged through the same process and using the same materials for process optimization.

As discussed above, a size (e.g., an area) of the dummy buffer unit is smaller than that of the dummy logic unit so that a spare area is presented between the clock signal line and the display area. In this case, the block is disposed in the spare area. In an example embodiment of the present disclosure, the spare area can be presented between the dummy logic unit and the display area AA. In an example embodiment of the present disclosure, the spare area can be presented between dummy logic unit and the gate low potential voltage line, but not limited thereto.

The block 21 is separated from other elements. For example, the block 21 is floated in the non-display area AA. The block 21 is not connected to the clock signal line CLKL, the gate high potential voltage line GVDD, the gate driving panel circuit GIPC (e.g., the logic unit LOGIC, the dummy logic unit DM_LOGIC, the buffer units BUF1 and BUF2 and the dummy buffer units DM_BUF1 and DM_BUF2), the gate low potential voltage line GVSS and the pixel PXL.

Figure 8:
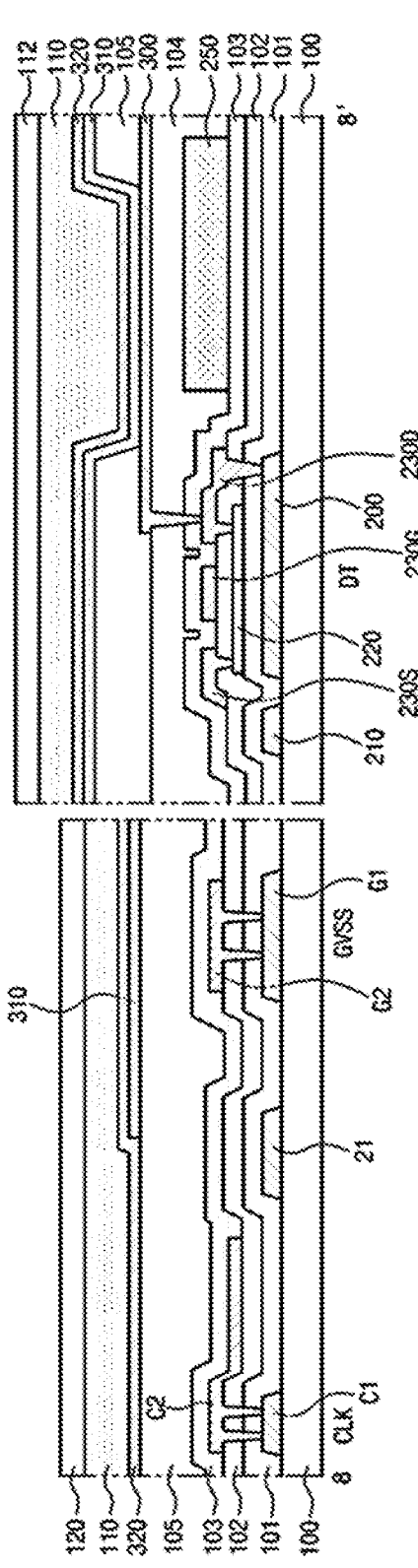
FIG. 8 is a cross-sectional view taken along line 8-8' in FIG. 4.

FIG. 8 is a cross-sectional view taken along line 8-8' in FIG. 4.

Referring to FIG. 8, the clock line unit CLK, the block 21, and the gate low potential voltage line GVSS can be disposed in the non-display area NA, and the driving TFT DT for the emission in the pixel PXL can be disposed in the display area AA.

In the non-display area NA and on the substrate 100, a first clock signal line C1 of the clock line unit CLK and a first gate low potential voltage line G1 of the gate low potential voltage line GVSS can be disposed. In the display area AA and on the substrate 100, the data line 210, which is connected to the driving TFT DT through the switching TFT ST, and a light shielding layer 200, which blocks the light into an active layer 220 of the driving TFT DT, can be disposed.

The substrate 100 can include a flexible polymer film. For example, the flexible polymer film can be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto. Alternatively, the substrate 100 can include a glass or a multiple layer where an organic layer and an inorganic layer are alternately laminated. For example, the substrate 100 can include an organic insulating material layer such as polyimide (PI) and an inorganic insulating material layer such as silicon oxide (SiO2) alternately laminated.

The first clock signal line C1, the block 21, and first gate low potential voltage line G1 in the non-display area NA and the data line 210 and light shielding layer 200 in the display area AA can be formed through the same process and of the same materials. For example, the first clock signal line C1, the block 21, and first gate low potential voltage line G1 in the non-display area NA and the data line 210 and light shielding layer 200 in the display area AA can be disposed at the same layer.

When light is incident onto the semiconductor layer 220 formed of a metal oxide material, the threshold voltage can change and a change in device characteristics can occur. The light shielding layer 200 is formed under the semiconductor layer 220 to block the light onto the semiconductor layer 220.

The first clock signal line C1, the block 21, and first gate low potential voltage line G1 in the non-display area NA and the data line 210 and light shielding layer 200 in the display area AA can include at least one of titanium (Ti), molybdenum (Mo), copper (Cu), aluminum (Al), silver (Ag), chromium (Cr), gold (Au), neodymium (Nd), nickel (Ni) and their alloys, but it is not limited thereto. Each of the first clock signal line C1, the block 21, and first gate low potential voltage line G1 in the non-display area NA and the data line 210 and light shielding layer 200 in the display area AA can include an opaque metallic material.

A buffer layer 101 can be disposed on the first clock signal line C1, the block 21, and first gate low potential voltage line G1 in the non-display area NA and the data line 210 and light shielding layer 200 in the display area AA.

The buffer layer 101 can improve the adhesion between the layers, which is formed on the substrate 100, and the substrate 100 and block various types of defect factors, such as alkaline components leaking from the substrate 100. In addition, the buffer layer 101 can prevent moisture or oxygen, which penetrates into the substrate 100, from diffusing and can electrically insulate the light shielding layer 200 and the semiconductor layer 220.

The buffer layer 101 can be formed as a single layer of silicon nitride (SiNx) or silicon oxide (SiOx) or multiple layers thereof, but it is not limited thereto. For example, the buffer layer can be formed by inorganic film in a single layer or in multiple layers, for example, the inorganic film in a single layer can be a silicon oxide (SiOx) film or a silicon nitride (SiNx) film, and inorganic films in multiple layers can formed by alternately stacking one or more silicon oxide (SiOx) films, one or more silicon nitride (SiNx) films, and one or more amorphous silicon (a-Si), but the present disclosure is not limited thereto.

The semiconductor layer 220 can be disposed on the buffer layer 101 in the display area AA. The semiconductor layer 220 can be formed of metal oxide, e.g., indium-gallium-zinc-oxide (IGZO), indium-zinc-oxide (IZO), indium-gallium-tin-oxide (IGTO), or indium-gallium-tin-oxide (IGO), but it is not limited thereto.

In addition, the semiconductor layer 220 can be formed of a low temperature polycrystalline silicon (LTPS) semiconductor, but it is not limited thereto.

A gate insulating layer 102 can be disposed on the semiconductor layer 220. The gate insulating layer 102 can be formed of an inorganic insulating material such as silicon nitride (SiNx) or silicon oxide (SiOx). For example, the gate insulating layer 102 can be formed by inorganic film in a single layer or in multiple layers, for example, the inorganic film in a single layer can be a silicon oxide (SiOx) film or a silicon nitride (SiNx) film, and inorganic films in multiple layers can formed by alternately stacking one or more silicon oxide (SiOx) films, one or more silicon nitride (SiNx) films, and one or more amorphous silicon (a-Si), but the present disclosure is not limited thereto. Alternatively, the gate insulating layer 102 can be formed of an insulating inorganic material or organic material, but it is not limited thereto.

The gate insulating layer 102 can extend to the non-display area NA and cover the clock line unit CLK.

A second signal line C2 and a second gate low potential voltage line G2 can be disposed on the gate insulating layer 102 in the non-display area NA.

The second signal line C2 can be electrically connected to the first signal line C1 through a contact hole formed in the buffer layer 101 and the gate insulating layer 102, thereby providing the clock signal to the gate driving panel circuit GIPC. In addition, the resistance of the first signal line C1 can be reduced.

The second gate low potential voltage line G2 can be electrically connected to the first gate low potential voltage line G1 through a contact hole formed in the buffer layer 101 and the gate insulating layer 102. The second gate low potential voltage line G2 is formed to overlap the first gate low potential voltage line G1 and can reduce the resistance of the first gate low potential voltage line G1.

A source electrode 230S, which is connected to the semiconductor layer 220 through a contact hole in the gate insulating layer 102 of the driving TFT DT, can be formed on the gate insulating layer 102 and in the display area AA. In addition, a source electrode, which is connected to the data line 210 through a contact hole in the buffer layer 101 and the gate insulating layer 102 of the switching TFT ST, can be formed on the gate insulating layer 102 and in the display area AA.

A gate electrode 230G and a drain electrode 230D, which is connected to the semiconductor layer 220 through a contact hole in the gate insulating layer 102 and the light shielding layer 200 through a contact hole in the buffer layer 101 and the gate insulating layer 102, are formed on the gate insulating layer 102 and in the display area AA.

The second clock signal line C2, the second gate low potential voltage line G2, the source electrode 230S, the gate electrode 230G, and the drain electrode 230D can be formed using the same process and the same material. For example, the second clock signal line C2, the second gate low potential voltage line G2, the source electrode 230S, the gate electrode 230G, and the drain electrode 230D can be disposed at the same layer.

The second clock signal line C2, the second gate low potential voltage line G2, the source electrode 230S, the gate electrode 230G, and the drain electrode 230D can be formed of at least one of titanium (Ti), molybdenum (Mo), and copper (Cu), aluminum (Al), silver (Ag), chromium (Cr), gold (Au), neodymium (Nd), nickel (Ni), and their alloys, but it is not limited thereto.

An insulating layer 103 can be disposed on the second clock signal line C2, the second gate low potential voltage line G2, the source electrode 230S, the gate electrode 230G and the drain electrode 230D.

The insulating layer 103 can be formed of an inorganic insulating material, e.g., silicon nitride (SiNx) or silicon oxide (SiOx), or an organic insulating organic material, but it is not limited thereto. For example, the insulating layer 103 can be formed by inorganic film in a single layer or in multiple layers, for example, the inorganic film in a single layer can be a silicon oxide (SiOx) film or a silicon nitride (SiNx) film, and inorganic films in multiple layers can formed by alternately stacking one or more silicon oxide (SiOx) films, one or more silicon nitride (SiNx) films, and one or more amorphous silicon (a-Si), but the present disclosure is not limited thereto.

When the pixel PXL is operated as a bottom-emission type, a color filter 250 can be disposed on the insulating layer 103 and in the emission area. The color filter 250 can be disposed in each pixel PXL. When the light emitting element provide white emission, a red color filter, a green color filter and a blue color filter can be disposed in a red pixel, a green pixel and a blue pixel, respectively.

When the pixel PXL is operated as a top-emission type, the color filter 250 can be disposed over the cathode 320. Alternatively, when the light emitting element provides red, green and blue light in each of the red, green and blue pixels, the color filter 250 can be omitted.

An overcoat layer 104 can be disposed on the color filter 250. The overcoat layer 104 can be disposed only in the display area AA or can further extend into a portion of the non-display area NA.

The overcoat layer 104 can be formed of an organic insulating material. For example, the overcoat layer 104 can be formed of at least one of benzocyclobutene (BCB), acryl resin, epoxy resin, phenolic resin, polyamide resin, and polyimide resin, but it is not limited thereto.

An anode 300, which is electrically connected to the drain electrode 230D, can be disposed on the overcoat layer 104.

The anode 300 can be connected to the drain electrode 230D through a contact hole formed in the overcoat layer 104.

The anode 300 can be formed of at least one of silver (Ag), aluminum (Al), gold (Au), molybdenum (Mo), tungsten (W), chromium (Cr), lead (Pd), indium-tin-oxide (ITO), indium-zinc-oxide (IZO), and their alloys, but it is not limited thereto.

A bank 105 can be disposed on the anode 300. The bank 105 can divide a plurality of pixels PXL. The bank 105 can minimize light blurring and color mixing at various viewing angles.

The bank 105 exposes the anode 300 corresponding to the emission area and can overlap with the end of the anode 300.

In addition, the bank 105 can extend into the non-display area NA to cover the gate low potential voltage line GVSS, the block 21, and the clock line unit CLK.

The bank 105 can be formed of an inorganic insulating material, e.g., silicon nitride (SiNx) or silicon oxide (SiOx), or an organic insulating material, e.g., BCB, acryl resin, epoxy resin, phenolic resin, or polyamide, but it is not limited thereto.

For example, the bank 105 can include an opaque material (e.g., black material) to prevent a light interference between the adjacent subpixels. The bank 105 can include a shielding material of at least one of a color pigment, an organic black and a carbon.

A spacer can be disposed on the bank 105. The spacer can ensure a gap between a fine metal mask (FMM) and the anode 300 so that the FMM is not in contact with the anode 300 in a deposition process of a light emitting layer.

An organic light emitting layer 310 can be disposed on the bank 105 and the anode 300. The organic light emitting layer 310 of this specification can be a white organic light emitting layer having a plurality of emitting material layers, but it is not limited thereto.

The light emitting layer 310 can be deposited on an entire of the display area AA and can extend to the non-display area NA to overlap the gate low potential voltage line GVSS and at least a portion of one or more blocks 21. For example, an end of the light emitting layer 310 can be positioned over the block 21.

A cathode 320 can be disposed on the light emitting layer 310. The cathode 320 can be formed on an entire of the display area AA and extends to the non-display area NA to overlap the clock line unit CLK, the gate driving panel circuit GIPC, the gate low potential voltage line GVSS and the block 21. The cathode 320 can have an area larger than the light emitting layer 310 to cover a side surface of the light emitting layer.

The cathode 320 can include an opaque conductive material. For example, the cathode 320 can be formed of at least one of silver (Ag), aluminum (Al), gold (Au), molybdenum (Mo), tungsten (W), chromium (Cr), and their alloys, it is not limited thereto.

In addition, in the case of top emission, the cathode 320 can include a transparent conductive material. For example, the cathode 320 can be formed of at least one of indium tin oxide (ITO) and indium zinc oxide (IZO), but it is not limited thereto.

An encapsulation layer can be disposed on the cathode. In an example embodiment of the present disclosure, the encapsulation layer can include a first encapsulation layer 110 and a second encapsulation layer 112.

The first encapsulation layer 110 can be disposed on the cathode 320. The first encapsulation layer 110 can include an inorganic material and/or an organic material. The first encapsulation layer 110 can be formed of at least one of silicon nitride (SiNx), silicon oxide (SiOx), aluminum oxide (AlyOz), silicon oxycarbon (SiOCz) epoxy, polyimide, polyethylene and acrylate, but it is not limited thereto.

In addition, the first encapsulation layer 110 can be formed as an adhesive layer. The adhesive layer can be a thermosetting resin and can further include a moisture absorbent with hygroscopic properties.

The second encapsulation layer 112 can be disposed on the first encapsulation layer 110. The second encapsulation layer 112 can include an inorganic material and/or an organic material. The second encapsulation layer 112 can be formed of at least one of silicon nitride (SiNx), silicon oxide (SiOx), aluminum oxide (AlyOz), silicon oxycarbon (SiOCz) epoxy, polyimide, polyethylene and acrylate, but it is not limited thereto.

Alternatively, the second encapsulation layer 112 can be a metal layer. The second encapsulation layer 112 can be formed of at least one of Fe (iron), Ni (nickel), titanium (Ti), molybdenum (Mo), copper (Cu), aluminum (Al), silver (Ag), chromium (Cr), gold (Au), neodymium (Nd), nickel (Ni), and their alloys, but it is not limited thereto.

The first encapsulation layer 110 and the second encapsulation layer 112 can be disposed to extend into the non-display area.

The first encapsulation layer 110 and the second encapsulation layer 112 cover the gate driving panel circuit GIPC, the block 21, and the clock line unit CLK and can extend to the end of the substrate 100. The second encapsulation layer 112 can be disposed to extend closer to the end of the substrate 100 than the first encapsulation layer 110.

Alternatively, a first inorganic encapsulation layer, a second organic encapsulation layer, and a third inorganic encapsulation layer that sequentially stacked can be disposed on the cathode 320. The first inorganic encapsulation layer and the third inorganic encapsulation layer can be made of an inorganic material such as silicon oxide (SiOx) or silicon nitride (SiNx). The second organic encapsulation layer can be made of an organic material such as acrylic resin, epoxy resin, phenolic resin, polyamide resin, and polyimide resin. Materials of the first inorganic encapsulation layer, the second organic encapsulation layer and the third inorganic encapsulation layer are not limited thereto. Meanwhile, the encapsulation layers are not limited to three layers, for example, n layers alternately stacked between inorganic encapsulation layer and organic encapsulation layer (where n is an integer greater than 3) can be included.

Figure 9:
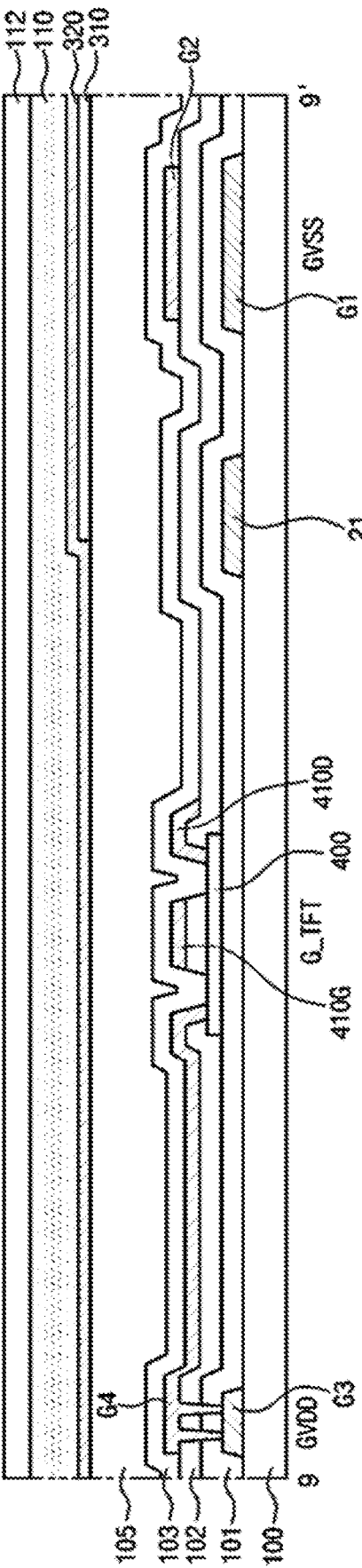
FIG. 9 is a cross-sectional view taken along line 9-9' in FIG. 7.

FIG. 9 is a cross-sectional view taken along line 9-9' in FIG. 7.

Referring to FIG. 9, a gate high potential voltage line GVDD, a gate circuit transistor G_TFT in a gate driving panel circuit GIPC, a block 21 and a gate low potential voltage line GVSS are disposed on or over the substrate 100.

A plurality of transistors can be disposed in the gate driving panel circuit GIPC.

The gate high potential voltage line GVDD, the gate circuit transistor G_TFT disposed in the gate driving panel circuit GIPC, the block 21, and the gate low potential voltage line GVSS can be formed by the same process and of the same material for mask reduction and process convenience. For example, the gate high potential voltage line GVDD, the gate circuit transistor G_TFT disposed in the gate driving panel circuit GIPC, the block 21, and the gate low potential voltage line GVSS can be disposed at the same layer.

When describing the components of FIG. 9, the descriptions of components that are the same as or correspond to the components of FIG. 8 will be omitted or simplified.

A first gate high potential voltage line G3 of the gate high potential voltage line GVDD, the block 21 and a first gate low potential voltage line G1 of the gate low potential voltage line GVSS can be disposed on the substrate 100.

The first gate high potential voltage line G3 of the gate high potential voltage line GVDD, the block 21 and the first gate low potential voltage line G1 of the gate low potential voltage line GVSS can be formed using the same process and the same material. For example, the first gate high potential voltage line G3 of the gate high potential voltage line GVDD, the block 21 and the first gate low potential voltage line G1 of the gate low potential voltage line GVSS can be disposed at the same layer.

The first gate high potential voltage line G3, the block 21 and the first gate low potential voltage line G1 can be formed of at least one of titanium (Ti), molybdenum (Mo), and copper (Cu), aluminum (Al), silver (Ag), chromium (Cr), gold (Au), neodymium (Nd), nickel (Ni) and their alloys, but it is not limited thereto.

The buffer layer 101 can be disposed on the first gate high potential voltage line G3, the block 21 and the first gate low potential voltage line G1.

The buffer layer 101 can be formed of an inorganic insulating material or an organic insulating material. For example, the buffer layer 101 can be formed of silicon nitride (SiNx) or silicon oxide (SiOx). For example, the buffer layer 101 can be formed by inorganic film in a single layer or in multiple layers, for example, the inorganic film in a single layer can be a silicon oxide (SiOx) film or a silicon nitride (SiNx) film, and inorganic films in multiple layers can formed by alternately stacking one or more silicon oxide (SiOx) films, one or more silicon nitride (SiNx) films, and one or more amorphous silicon (a-Si), but the present disclosure is not limited thereto.

A semiconductor layer 400 of the gate circuit transistor G_TFT can be disposed on the buffer layer 101. The semiconductor layer 400 can be formed of metal oxide, e.g., indium-gallium-zinc-oxide (IGZO), indium-zinc-oxide (IZO), indium-gallium-tin-oxide (IGTO), or indium-gallium-tin-oxide (IGO).

In addition, the semiconductor layer 400 can be formed of a low temperature polycrystalline silicon (LTPS) semiconductor, but it is not limited thereto.

The gate insulating layer 102 can be disposed on the semiconductor layer 400 and the buffer layer 101.

The semiconductor layer 400 and the gate electrode 410G of the gate driving panel circuit GIPC can be insulated by the gate insulating layer 102.

The gate insulating layer 102 can be formed of an inorganic insulating material such as silicon nitride (SiNx) or silicon oxide (SiOx). For example, the gate insulating layer 102 can be formed by inorganic film in a single layer or in multiple layers, for example, the inorganic film in a single layer can be a silicon oxide (SiOx) film or a silicon nitride (SiNx) film, and inorganic films in multiple layers can formed by alternately stacking one or more silicon oxide (SiOx) films, one or more silicon nitride (SiNx) films, and one or more amorphous silicon (a-Si), but the present disclosure is not limited thereto. Alternatively, the gate insulating layer 102 can be formed of an insulating inorganic material or organic material, but it is not limited thereto.

The gate electrode 410G and a drain electrode 410D of the gate driving panel circuit GIPC and a second gate high potential voltage line G4 can be disposed on the gate insulating layer 102. The second gate high potential voltage line G4 is connected to the first gate high potential voltage line G4 through a contact hole in the gate insulating layer 102 and the buffer layer 101. The second gate high potential voltage line extends into a portion of the gate circuit transistor G_TFT and contact the semiconductor layer 400 of the gate circuit transistor G_TFT to serve as a source electrode of the gate circuit transistor G_TFT.

A second gate low potential voltage line G2 overlapping the first gate low potential voltage line G1 is disposed on the gate insulating layer 102. As illustrated with FIG. 8, the second gate low potential voltage line G2 is connected to the first gate low potential voltage line G1 so that the resistance of the first gate low potential voltage line G1 can be lowered.

The second gate high potential voltage line G4, the gate electrode 410G, the drain electrode 410D and the second gate low potential voltage line G2 can be formed through the same process and using the same material. For example, the second gate high potential voltage line G4, the gate electrode 410G, the drain electrode 410D and the second gate low potential voltage line G2 can be disposed at the same layer.

The second gate high potential voltage line G4, the gate electrode 410G, the drain electrode 410D and the second gate low potential voltage line G2 can be formed of at least one of silver (Ag), molybdenum (Mo), copper (Cu), titanium (Ti), aluminum (Al), chromium (Cr), gold (Au), nickel (Ni), neodymium (Nd), tungsten (W), gold (Au) and their alloys, but it is not limited thereto. Each of the second gate high potential voltage line G4, the gate electrode 410G, the drain electrode 410D and the second gate low potential voltage line G2 can have a single-layered structure or a multi-layered structure.

The insulating layer 103 can be disposed on the second gate high potential voltage line G4, the gate electrode 410G, the drain electrode 410D and the second gate low potential voltage line G2.

The insulating layer 103 can include a first insulating layer and a second insulating layer. Each of the first and second insulating layers can be formed of an inorganic insulating material or an organic insulating material. For example, each of the first and second insulating layers can be formed of silicon nitride (SiNx) or silicon oxide (SiOx), but it is not limited thereto. For example, each of the first and second insulating layers can be formed by inorganic film in a single layer or in multiple layers, for example, the inorganic film in a single layer can be a silicon oxide (SiOx) film or a silicon nitride (SiNx) film, and inorganic films in multiple layers can formed by alternately stacking one or more silicon oxide (SiOx) films, one or more silicon nitride (SiNx) films, and one or more amorphous silicon (a-Si), but the present disclosure is not limited thereto.

The bank 105 can be disposed on the insulating layer 103 and can extend into a portion of the non-display area NA.

The organic light emitting layer 310 can be disposed on the bank 105 in the non-display area NA to overlap the gate low potential voltage line GVSS and at least a portion of one or more blocks 21. For example, an end of the light emitting layer 310 can be positioned over the block 21.

The cathode 320, the first encapsulation layer 110 and the second encapsulation layer 120 extend to the non-display area NA and on or over the light emitting device 310 to cover (e.g., overlap) the gate low potential voltage line GVSS, the block 21, the gate driving panel circuit GIPC, the gate high potential voltage line GVDD and the clock line unit CLK.

According to an example embodiment of the present disclosure, a display device includes a substrate including a display area and a non-display area disposed at at least one side of the display area; a clock signal line disposed in the non-display area; a spare area disposed between the clock signal line and the display area; and a block disposed in the spare area.

In the display device according to an example embodiment of the present disclosure, the display device further includes a gate driving panel circuit and a gate power voltage line disposed in the non-display area.

In the display device according to an example embodiment of the present disclosure, the display device further includes a plurality of transistors disposed in the gate driving panel circuit.

In the display device according to an example embodiment of the present disclosure, the block includes an opaque metal layer.

In the display device according to an example embodiment of the present disclosure, a single block having an area corresponding to the spare area is disposed in the spare area.

In the display device according to an example embodiment of the present disclosure, a plurality of blocks are arranged in the spare area.

In the display device according to an example embodiment of the present disclosure, the spare area is presented in four or more areas in the non-display area.

In the display device according to an example embodiment of the present disclosure, the display area includes a plurality of pixels, and each of the plurality of pixels includes at least one switching transistor and at least one driving transistor.

In the display device according to an example embodiment of the present disclosure, each of the plurality of pixels further includes an anode, a light emitting layer on the anode and a cathode on the light emitting layer, and the anode is connected to the driving transistor.

In the display device according to an example embodiment of the present disclosure, the driving transistor includes a light shielding layer on the substrate; a buffer layer on the light shielding layer; a semiconductor layer on the buffer layer; a gate electrode over the semiconductor layer; and a source electrode and a drain electrode each connected to the semiconductor layer.

The display device according to an example embodiment of the present disclosure further includes an overcoat layer on the gate electrode, the source electrode and the drain electrode; and a bank on the overcoat layer.

The display device according to an example embodiment of the present disclosure further includes an encapsulation layer disposed on the cathode.

In the display device according to an example embodiment of the present disclosure, each of the clock signal line and the gate power voltage line includes a plurality of lines.

In the display device according to an example embodiment of the present disclosure, the gate power voltage line includes a gate high potential voltage line and a gate low potential voltage line.

In the display device according to an example embodiment of the present disclosure, the clock signal line, the gate high potential voltage line and the gate low potential voltage line are disposed at the same layer.

In the display device according to an example embodiment of the present disclosure, the light emitting layer and the cathode extend into the non-display area.

In the display device according to an example embodiment of the present disclosure, the light emitting layer overlaps the gate low potential voltage line and a part of the block.

In the display device according to an example embodiment of the present disclosure, the cathode overlaps the gate driving panel circuit and the block.

In the display device according to an example embodiment of the present disclosure, each of plurality of transistors in the gate driving panel circuit includes a semiconductor layer, a source electrode and a drain electrode, and at least one of the plurality of transistors disposed in the gate driving panel circuit is electrically connected to the clock signal line.

The display device according to an example embodiment of the present disclosure further includes an encapsulation layer disposed over and overlapping the clock signal line, the gate driving panel circuit and the gate power voltage line.

In the display device according to an example embodiment of the present disclosure, the spare area is adjacent to at least one of a starting portion of the gate driving panel circuit and an ending portion of the gate driving panel circuit.

In the display device according to an example embodiment of the present disclosure, at least one of the starting portion and the ending portion of the gate driving panel circuit includes a dummy gate driving panel circuit.

In the display device according to an example embodiment of the present disclosure, the dummy gate driving panel circuit includes a dummy logic unit and a first dummy buffer unit, and a size of the first dummy buffer unit is smaller than a size of the dummy logic unit.

In the display device according to an example embodiment of the present disclosure, the block includes at least one of titanium (Ti), molybdenum (Mo), copper (Cu), aluminum (Al), silver (Ag), chromium (Cr), gold (Au), neodymium (Nd), nickel (Ni) and their alloys.

In the display device according to an example embodiment of the present disclosure, the light shielding layer is disposed at the same layer and is of the same material as the block.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

What is claimed is:

1. A display device, comprising:
a substrate including a display area and a non-display area disposed at at least one side of the display area;
a clock signal line disposed in the non-display area;
an encapsulation layer on the cathode;
a gate driving panel circuit disposed in the non-display area;
a gate power voltage line disposed in the non-display area;
a spare area disposed between the clock signal line and the display area; and
one or more blocks disposed in the spare area,
wherein the display area includes a plurality of pixels, and each of the plurality of pixels includes an anode, a light emitting layer on the anode and a cathode on the light emitting layer,
wherein the light emitting layer and the cathode extend into the non-display area,
wherein the cathode overlaps the one or more blocks and the gate driving panel circuit, and
wherein each of the clock signal line and the gate power voltage line includes a plurality of lines.

2. The display device according to claim 1, wherein each of the one or more blocks includes an opaque metal layer.

3. The display device according to claim 1, wherein a single block having an area corresponding to the spare area is disposed in the spare area.

4. The display device according to claim 1, wherein a plurality of the blocks are arranged in the spare area.

5. The display device according to claim 1, wherein the spare area is presented in four or more areas in the non-display area.

6. The display device according to claim 1, wherein each of the plurality of pixels further includes at least one switching transistor and at least one driving transistor.

7. The display device according to claim 6, wherein the anode is connected to the corresponding driving transistor.

8. The display device according to claim 6, wherein each driving transistor includes:
a light shielding layer on the substrate;
a buffer layer on the light shielding layer;
a semiconductor layer on the buffer layer;
a gate electrode on the semiconductor layer; and a source electrode and a drain electrode each connected to the semiconductor layer.

9. The display device according to claim 8, further comprising:

an overcoat layer on the gate electrode, the source electrode and the drain electrode; and a bank on the overcoat layer.

10. The display device according to claim 8, wherein the light shielding layer is disposed at a same layer as the one or more blocks, and includes a same material as the one or more blocks.

11. The display device according to claim 1, wherein the gate power voltage line includes a gate high potential voltage line and a gate low potential voltage line.

12. The display device according to claim 11, wherein the clock signal line, the gate high potential voltage line and the gate low potential voltage line are disposed at a same layer.

13. The display device according to claim 11, wherein the light emitting layer overlaps the gate low potential voltage line and a part of the one or more blocks.

14. The display device according to claim 1, wherein a plurality of transistors are disposed in the gate driving panel circuit, each of the plurality of transistors includes a semiconductor layer, a source electrode and a drain electrode, and at least one of the plurality of transistors disposed in the gate driving panel circuit is electrically connected to the clock signal line.

15. The display device according to claim 1, wherein the encapsulation layer overlaps the clock signal line, the gate driving panel circuit and the gate power voltage line.

16. The display device according to claim 15, wherein the spare area is adjacent to at least one of a starting portion of the gate driving panel circuit and an ending portion of the gate driving panel circuit.

17. The display device according to claim 16, wherein at least one of the starting portion and the ending portion of the gate driving panel circuit includes a dummy gate driving panel circuit.

18. The display device according to claim 17, wherein the dummy gate driving panel circuit includes a dummy logic unit and a first dummy buffer unit, and wherein a size of the first dummy buffer unit is smaller than a size of the dummy logic unit.

19. The display device according to claim 1, wherein each of the one or more blocks includes at least one of titanium (Ti), molybdenum (Mo), copper (Cu), aluminum (Al), silver (Ag), chromium (Cr), gold (Au), neodymium (Nd), nickel (Ni) or their alloys.

20. The display device according to claim 1, wherein the light emitting layer overlaps at least a part of the one or more blocks.

* * * * *